(12) United States Patent
Miyashita

(10) Patent No.: US 7,928,809 B2
(45) Date of Patent: Apr. 19, 2011

(54) SEMICONDUCTOR INTEGRATED CIRCUIT DEVICE

(75) Inventor: Daisuke Miyashita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 104 days.

(21) Appl. No.: 12/500,864

(22) Filed: Jul. 10, 2009

(65) Prior Publication Data

US 2010/0033259 A1     Feb. 11, 2010

(30) Foreign Application Priority Data

Aug. 11, 2008   (JP) ................................ 2008-207378

(51) Int. Cl.
H03B 5/04   (2006.01)
(52) U.S. Cl. ............... 331/108 C; 331/117 FE; 257/401
(58) Field of Classification Search ............... 331/108 C, 331/108 R, 117 D, 117 FE, 167; 257/368, 257/386–389, 401
See application file for complete search history.

(56) References Cited

U.S. PATENT DOCUMENTS

| 7,327,201 | B2 | 2/2008 | Miyashita et al. | |
| 7,741,922 | B2* | 6/2010 | Lee et al. | 331/108 C |
| 2004/0140511 | A1* | 7/2004 | Nakatani et al. | 257/401 |
| 2008/0157222 | A1* | 7/2008 | Wang | 257/401 |

FOREIGN PATENT DOCUMENTS

JP     5-300011     11/1993

\* cited by examiner

Primary Examiner — Joseph Chang
Assistant Examiner — Jeffrey Shin
(74) Attorney, Agent, or Firm — Oblon, Spivak, McClelland, Maier & Neustadt, L.L.P.

(57) ABSTRACT

A semiconductor integrated circuit device includes a plurality of first gates each of which has a first protrusion section protruding from a first active region; a plurality of second gates each of which has a second protrusion section protruding from a second active region adjacent to the first active region in a direction opposite to a protruding direction of the first protrusion section; a second common interconnect which is formed on the first protrusion section of the plurality of first gates and on all drains of the second active region and connects the plurality of first gates and all drains of the second active region; and a third common interconnect which is formed on the second protrusion section of the plurality of second gates and on all drains of the first active region and connects the plurality of second gates and all drains of the first active region.

20 Claims, 7 Drawing Sheets

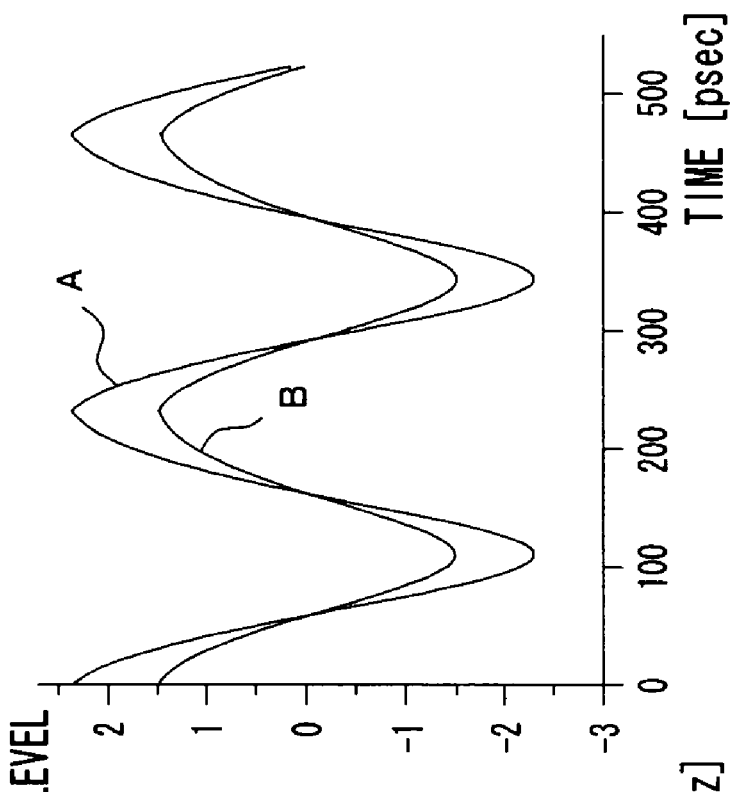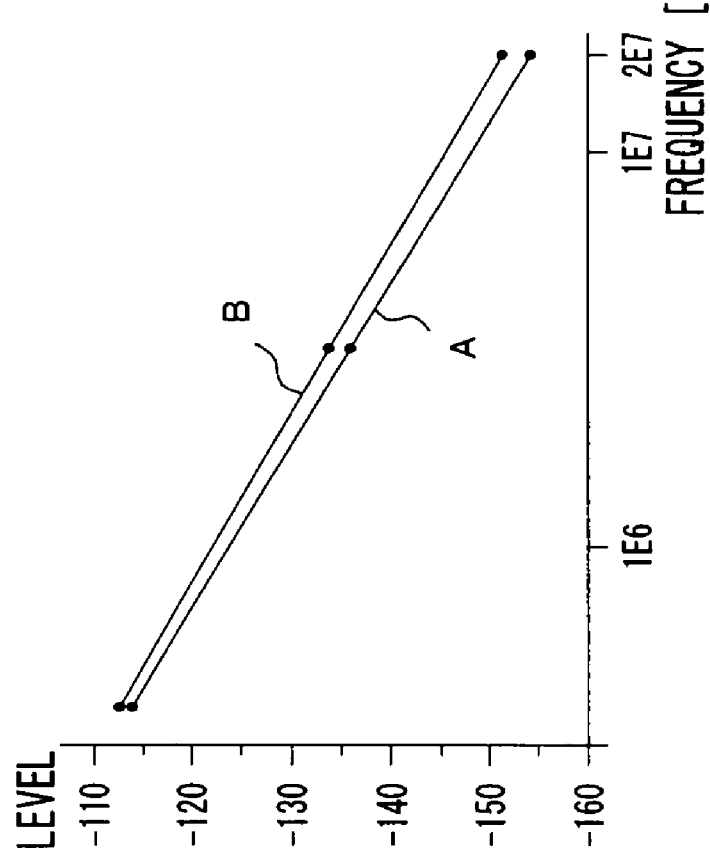

SEMICONDUCTOR INTEGRATED CIRCUIT DEVICE

CROSS-REFERENCE TO RELATED APPLICATION

This application is based upon and claims the benefit of priority from the prior Japanese Patent Application No. 2008-207378 filed in Japan on Aug. 11, 2008, the entire contents of which are incorporated herein by reference.

BACKGROUND OF THE INVENTION

1. Field of the Invention

The present invention relates to a semiconductor integrated circuit device suited to a voltage-controlled oscillator and the like configured to generate a plurality of oscillation outputs of a radio system and the like.

2. Description of Related Art

Conventionally, in a radio system of cellular phone and the like, a plurality of oscillation outputs of a local oscillator are generated by a frequency synthesizer in which a PLL (phase-locked loop) circuit or the like is used. In a PLL circuit or the like, a VCO (voltage-controlled oscillator) is used so that oscillation frequency can be easily controlled. For example, Japanese Patent Application Laid-Open Publication No. 5-300011 discloses a PLL circuit and a VCO which are each mounted on an IC chip.

That is, oscillation outputs are obtained by controlling the oscillation frequency of a VCO by use of a PLL circuit. An oscillation output of reference frequency (reference oscillation output) from a quartz-crystal oscillator and an output of the VCO are given to a phase comparator constituting the PLL circuit. The phase comparator finds a phase difference between the reference oscillation output and the oscillation output of the VCO and gives an output based on the phase difference as control voltage to the VCO via a low-pass filter. As a result of this, an oscillation output of reference frequency is obtained from the VCO. Furthermore, the output of the VCO is frequency-divided by a frequency divider and given to the phase comparator, whereby it is possible to obtain from the VCO an oscillation output having a frequency which is multiplied by the frequency dividing number of the reference frequency.

The VCO is composed of an LC resonance circuit provided with a varactor and an oscillation transistor for power supply. The LC oscillation circuit has an oscillation frequency based on the varactor and a fixed inductor, and an oscillation output having an oscillation frequency is obtained by the oscillation transistor. However, it is impossible to obtain an accurate oscillation frequency due to variations in elements constituting the VCO. Therefore, control voltage controlling the VCO is generated by the PLL circuit on the basis of a phase difference between the reference oscillation output and the VCO output and a capacitance value of the varactor is changed by this control voltage, whereby a fine adjustment is made so that the oscillation frequency of the VCO is made equal to a frequency corresponding to the reference frequency.

When a VCO is mounted on an IC chip, a differential configuration is often adopted for the oscillation transistor. That is, transistors in a differential pair are configured in such a manner that a gate and a drain are mutually connected. To ensure the oscillation of such a VCO, it is necessary for the oscillation transistor to have a gain sufficient for compensating for losses in the LC resonance circuit and have a sufficiently large gate width. Therefore, it is general practice to design the transistor pair to have a multi-finger configuration.

However, the transistor size of the transistor pair increases due to such multi-finger designs, and inevitably the length of an interconnect which connects the gate and drain of the transistor becomes long. For this reason, the gate-drain parasitic resistance increases, inducing deterioration in the characteristics of the VCO. Incidentally, it is conceivable that the parasitic resistance is reduced by increasing the interconnect width between the gate and the drain. In this case, however, the parasitic capacitance increases, with the result that the characteristics of the VCO deteriorate.

BRIEF SUMMARY OF THE INVENTION

A semiconductor integrated circuit device of an aspect of the present invention includes a first active region in which a source and a drain constituting one of transistors of a differential configuration are alternately arranged; a plurality of first gates each of which is formed between the source and drain of the first active region and each of which has a first protrusion section protruding from the first active region; a second active region in which a source and a drain constituting the other transistor of the transistors of a differential configuration are alternately arranged adjacent to the first active region; a plurality of second gates each of which is formed between the source and drain of the second active region and each of which has a second protrusion section protruding from the second active region in a direction opposite to a protruding direction of the first gate; a first common interconnect which connects all sources of the first and second active regions in common; a second common interconnect which is formed on the first protrusion section of the plurality of first gates and on all drains of the second active region and connects the plurality of first gates and all drains of the second active region; and a third common interconnect which is formed on the second protrusion section of the plurality of second gates and on all drains of the first active region and connects the plurality of second gates and all drains of the first active region.

BRIEF DESCRIPTION OF THE DRAWING

FIGS. 7A and 7B are graphs showing changes in characteristics of a VCO configured without the adoption of the second embodiment;

DETAILED DESCRIPTION OF THE INVENTION

First Embodiment

Figure 1:
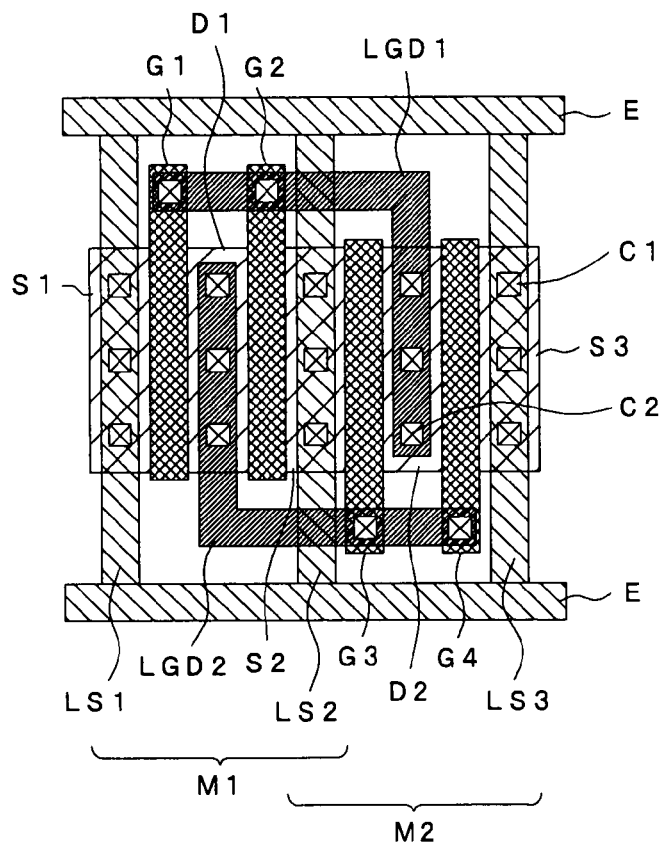
FIG. 1 is an explanatory diagram showing the layout of a semiconductor integrated circuit device related to a first embodiment of the present invention.
Figure 2:
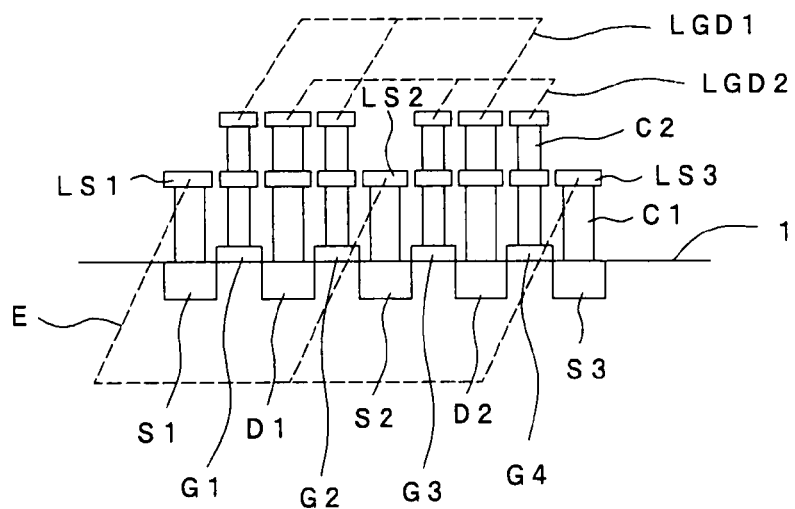
FIG. 2 is an explanatory diagram schematically showing the sectional structure of FIG. 1.
Figure 3:
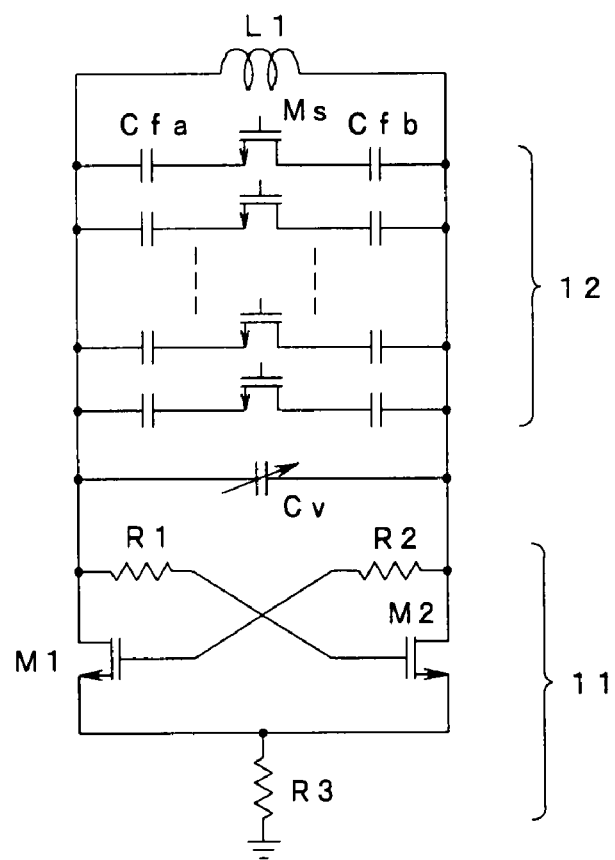
FIG. 3 is a circuit diagram showing the circuit configuration of a voltage-controlled oscillator in which an oscillation section of the present embodiment is used.

FIG. 1 is an explanatory diagram showing the layout of a semiconductor integrated circuit device related to the first embodiment of the present invention. FIG. 2 is an explanatory diagram schematically showing the sectional structure of FIG. 1. FIG. 3 is a circuit diagram showing the circuit configuration of a voltage-controlled oscillator in which an oscillation section of the present embodiment is used.

The semiconductor integrated circuit device of FIG. 1 constitutes an oscillation section of a voltage-controlled oscillator. First, with reference to FIG. 3 a description will be given of the circuit configuration of the voltage-controlled oscillator, which is an example of application of the present embodiment.

In FIG. 3, the voltage-controlled oscillator is composed of a coil L1, a variable capacitance element Cv such as a varactor, a variable capacitance section 12 and an oscillation section 11. The variable capacitance section 12 is configured in such a manner that a plurality of variable capacitors, in each of which fixed capacitors Cfa, Cfb and a MOS transistor Ms, which constitutes a switch, are connected in series, are connected in parallel. Each of the variable capacitors of the variable capacitance section 12, along with the variable capacitance element Cv, is connected in parallel to the coil L1.

One end of the coil L1 is connected to a drain of an NMOS transistor M1, which constitutes the oscillation section 11, and the other end thereof is connected to a drain of an NMOS transistor M2, which constitutes the oscillation section 11. Sources of the transistors M1, M2, which constitute a differential pair, are connected in common, and a connection point thereof is connected to a reference potential point via a resistance R3. The drain of the transistor M1 is connected to a gate of the transistor M2 via a parasitic resistance R1, and the drain of the transistor M2 is connected to a gate of the transistor M1 via a parasitic resistance R2. Incidentally, the parasitic resistances R1, R2 occur in interconnects which connect the drains of the transistors M1, M2 and the gates of the transistors M2, M1.

Incidentally, the voltage-controlled oscillator of FIG. 3 is such that the oscillation frequency is determined by an LC resonance circuit formed by the coil L1, the variable capacitance element Cv and the variable capacitance section 12. Incidentally, capacitance values Cf1, Cf2, . . . of each variable capacitor of the variable capacitance section 12 occur only when the transistor Ms constituting each variable capacitor is on. Therefore, the capacitance value of the whole variable capacitance section 12 is changed by the on-off control of the transistor Ms constituting each variable capacitor, whereby it is possible to control each oscillation frequency.

Incidentally, for the transistors M1, M2, it is necessary to set a sufficiently large gain in order to compensate for losses in the LC resonance circuit. For this reason, it is necessary that the transistor size of the transistors M1, M2 be sufficiently large. For example, the gate width of the transistors M1, M2 is made sufficiently large. For this purpose, in the present embodiment, a multi-finger configuration is adopted for the transistors M1, M2.

In FIG. 1, the transistor M1 is composed of sources S1, S2, a drain D1, gates G1, G2 and the like, and the transistor M2 is composed of sources S2, S3, a drain D2, gates G3, G4 and the like. The source S2 is shared by the transistors M1, M2, that is, the transistors M1, M2 have a multi-finger design in which the transistors M1, M2 are each designed so as to have two fingers.

As shown in FIG. 2, in an active region formed on a substrate 1, the sources S1 to S3 and the drains D1, D2 are configured in such a manner that the sources and the drains are alternately arranged. The transistors are configured by arranging a gate between a source and a drain which are alternately arranged. Incidentally, the expression that a source and a drain are alternately arranged refers to also a case where one drain is arranged between two sources, a case where a drain (drains) in quantities of N−1 is (are) arranged between sources in quantities of N, and the like.

The sources S1 to S3 and the drains D1, D2 are each formed in the shape of a long rectangle two-dimensionally, and the source S1, the drain D1, the source S2, the drain D2 and the source S3 are arranged in this order by being spaced from each other at a distance corresponding to the channel length in the transverse direction of the rectangle. Incidentally, the longitudinal dimensions of the sources S1 to S3 and the drains D1, D2 are equal to each other.

Upon the front surface of the substrate between the source S1 and the drain D1, the gate G1 is formed on a gate oxide film (not shown). Also upon the front surface of the substrate between the source S2 and the drain D1, the gate G2 is formed on a gate oxide film. As will be described later, because the sources S1, S2 are connected in common and the gates G1, G2 are also connected in common, the gate width of the transistor M1 becomes a sum of the gate widths of the gates G1, G2.

Similarly, upon the front surface of the substrate between the source S2 and the drain D2, the gate G3 is formed on a gate oxide film. Also upon the front surface of the substrate between the source S3 and the drain D2, the gate G4 is formed on a gate oxide film. As will be described later, because the sources S2, S3 are connected in common and the gates G3, G4 are also connected in common, the gate width of the transistor M2 becomes a sum of the gate widths of the gates G3, G4.

The sources S1, S2, S3 are connected to source interconnects LS1, LS2, LS3, respectively, each via a contact C1. The source interconnects LS1 to LS3 are connected in common to a common interconnect E. As shown in FIG. 3, the common interconnect E is connected to a reference potential point via the resistance R3.

As shown in FIG. 2, the source interconnects LS1 to LS3 and the common interconnect E are formed as lower-layer interconnects in the first interconnect layer on the substrate 1, and as shown in FIG. 2, the drain interconnects and the gate interconnects are formed as upper-layer interconnects in the second interconnect layer on the substrate 1.

In the present embodiment, common interconnects are used for the drain interconnects and the gate interconnects. That is, the drain D1 is connected to a common interconnect LGD2 via a contact C2, and the drain D2 is connected to a common interconnect LGD1 via the contact C2.

The common interconnect LGD2 extends on the drain D1 constituting the transistor M1 in the longitudinal direction of the drain D1. The common interconnect LGD2 is such that one end thereof leaves in an extended condition the region where the drain D1 is formed, and extends while bending in the transverse direction of the drain D1 to the side of the region where the transistor M2 is formed. On the other hand, one end of each of the gates G3, G4 constituting the transistor M2 has a protrusion section which leaves in an extended condition the region where the sources S2, S3 and the drain D2 are formed, and intersects the common interconnect LGD2 three-dimensionally. In this intersection (protrusion section), the gates G3, G4 are connected to the common interconnect LGD2 by the contact C2.

On the other hand, the common interconnect LGD1 extends on the drain D2 constituting the transistor M2 in the longitudinal direction of the drain D2. The common interconnect LGD1 is such that one end thereof leaves in an extended condition the region where the drain D2 is formed in a direction in which the common interconnect LGD1 does not overlap the common interconnect LGD2, and extends while bending in the transverse direction of the drain D2 to the side of the region where the transistor M1 is formed. On the other hand, one end of each of the gates G1, G2 constituting the transistor M1 has a protrusion section which leaves in an extended condition the region where the sources S1, S2 and the drain D1 are formed, and intersects the common interconnect LGD1 three-dimensionally. In this intersection (protrusion section), the gates G1, G2 are connected to the common interconnect LGD1 by the contact C2.

Incidentally, in FIG. 2, the common interconnect E, LGD1, LGD2 are indicated by broken lines. The common interconnects LGD1, LGD2 are each connected to both ends of the coil L1 of FIG. 3.

As shown in FIG. 1, the direction (the upward direction on the paper surface of FIG. 1) in which the gates G1, G2 leave in an extended condition the region where the sources S1, S2 and the drain D1 are formed and the direction (the downward direction on the paper surface of FIG. 1) in which the gates G3, G4 leave in an extended condition the region where the sources S2, S3 and the drain D2 are formed, are reverse to each other. Therefore, it is possible to arrange the contact between the gates of the transistor M1 and the common interconnect LGD1 and the contact between the gates of the transistor M2 and the common interconnect LGD2 in positions reverse to each other in the longitudinal direction of the sources and the drains. That is, as shown in FIG. 1, it is possible to ensure the arrangement in such a manner that the bent common interconnects LGD1, LGD2 do not overlap each other.

Therefore, according to the present embodiment, it is possible to connect the gates of the transistor M1 and the drains of the transistor M2 and to connect the gates of the transistor M2 and the drains of the transistor M1 in a relatively short distance by using only two interconnect layers, which are the lower layer and the upper layer.

Figure 4:
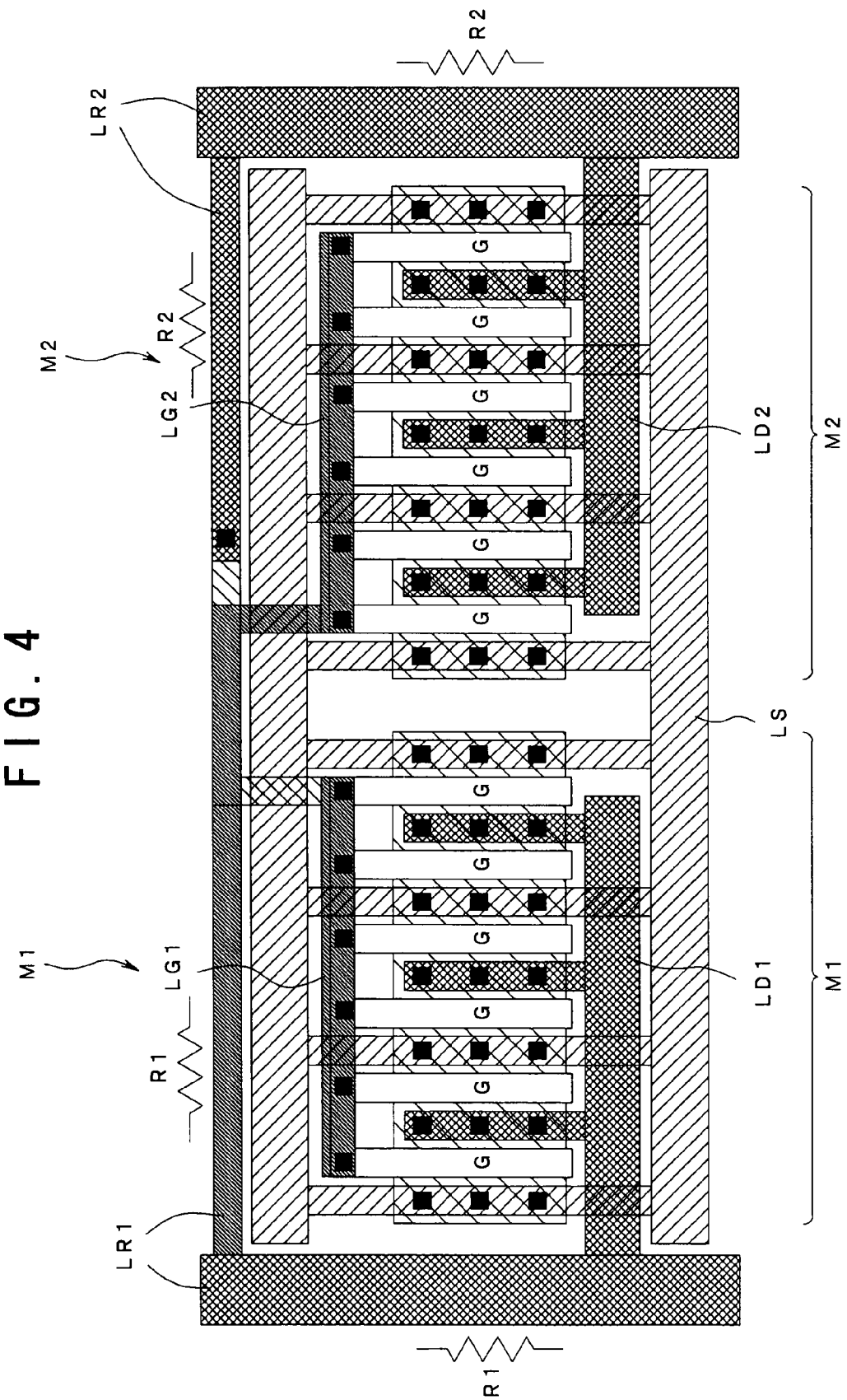
FIG. 4 is an explanatory diagram to explain the layout in a related art.

Next, for comparison, a layout in a related art will be described with reference to FIG. 4. FIG. 4 is an explanatory diagram to explain a layout in a related art. FIG. 4 shows an example of a multi-finger design in which the transistors M1, M2 are each designed so as to have six fingers. Incidentally, the black square marks of FIG. 4 indicate contacts.

In the example of FIG. 4, transistors M1, M2 are each composed of six gates G which are formed between six sources and six drains, respectively. The sources of the transistors M1, M2 are connected together by a common interconnect LS. The drains of the transistors M1 are connected together by a common interconnect LD1, and the drains of the transistors M2 are connected together by a common interconnect LD2. The gates of the transistor M1 are connected together by a common interconnect LG1, and the gates of the transistor M2 are connected together by a common interconnect LG2.

The gate interconnect LG2 of the transistor M2 is connected to the drain interconnect LD1 of the transistor M1 via an interconnect LR1 which bypasses a source-drain region of the transistor M1. Also, the common interconnect LG1 of the transistor M1 is connected to the common interconnect LD2 of the transistor M2 via an interconnect LR2 which bypasses a source-drain region of the transistor M2. The interconnects LR1, LR2 cause the parasitic resistances R1, R2 of FIG. 3, respectively.

In FIG. 4, the gate interconnect of one transistor is connected to the drain interconnect of the other transistor via an interconnect which bypasses the region where the other transistor is formed (hereinafter referred to as a bypass interconnect). Therefore, the interconnect length of the bypass interconnect is sufficiently long, causing a relatively large parasitic resistance to be generated.

In contrast to this, in the present embodiment, the gates and drains are formed in such a manner that the gates in the longitudinal direction protrude more than the drains in the longitudinal direction and that the protruding directions of the two transistors are reverse to each other. As a result of this, it is possible to arrange the position of contact between the gates G1, G2 and the common interconnect LGD1 and the position of contact between the gates G3, G4 and the common interconnect LGD2 are in directions reverse to each other, and it is possible to linearly connect the gate of one transistor to an interconnect protruding from the drain of the other transistor.

That is, in the transverse direction of the sources and drains, the common interconnects LGD1, LGD2 are each lengthened by an amount corresponding to the length of the region where the source is formed and the region where the gate is formed, whereby it is possible to perform connection between the gate of one transistor and the drain of the other transistor and connection between the gate of the other transistor and the drain of one transistor. As described above, it is possible to sufficiently shorten the length of a portion contributing to parasitic resistance in a common interconnect which cross-couples the gate and the drain, and hence it is possible to sufficiently reduce parasitic resistance.

Furthermore, it is possible to connect the sources in common by use of the lower-layer interconnect and to cross-couple the gate and the drain by use of the upper-layer interconnect. Each part of the transistors of a differential configuration can be connected by use of the two-level interconnect layer and hence the manufacture is easy. Incidentally, it is apparent that the sources may be connected in common by use of the upper-layer interconnect and that the gate and the drain may be cross-coupled by use of the lower-layer interconnect.

As described above, in the present embodiment, it is possible to sufficiently shorten the length of a portion contributing to parasitic resistance in a common interconnect which cross-couples the gate and the drain and hence it is possible to sufficiently reduce parasitic resistance. As a result of this, it is possible to sufficiently increase the gain of an oscillation transistor constituting a VCO and it is possible to improve the characteristics of the VCO.

Second Embodiment

Figure 6:
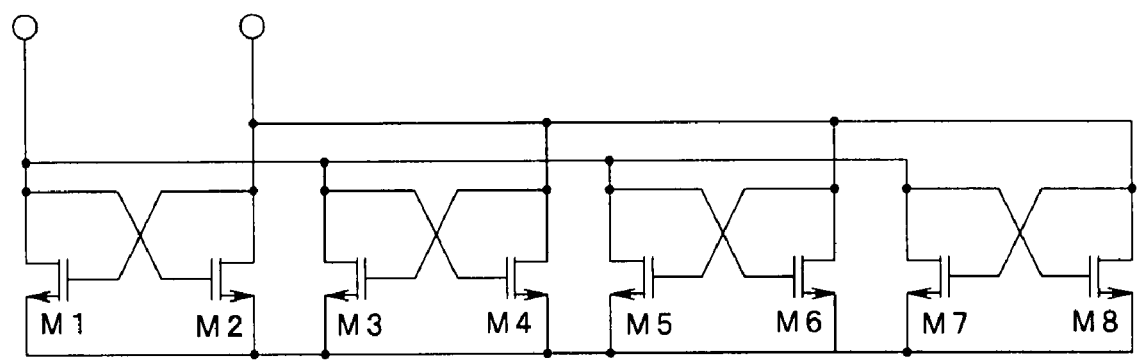
FIG. 6 is a circuit diagram showing a circuit configuration corresponding to FIG. 5.
Figure 5:
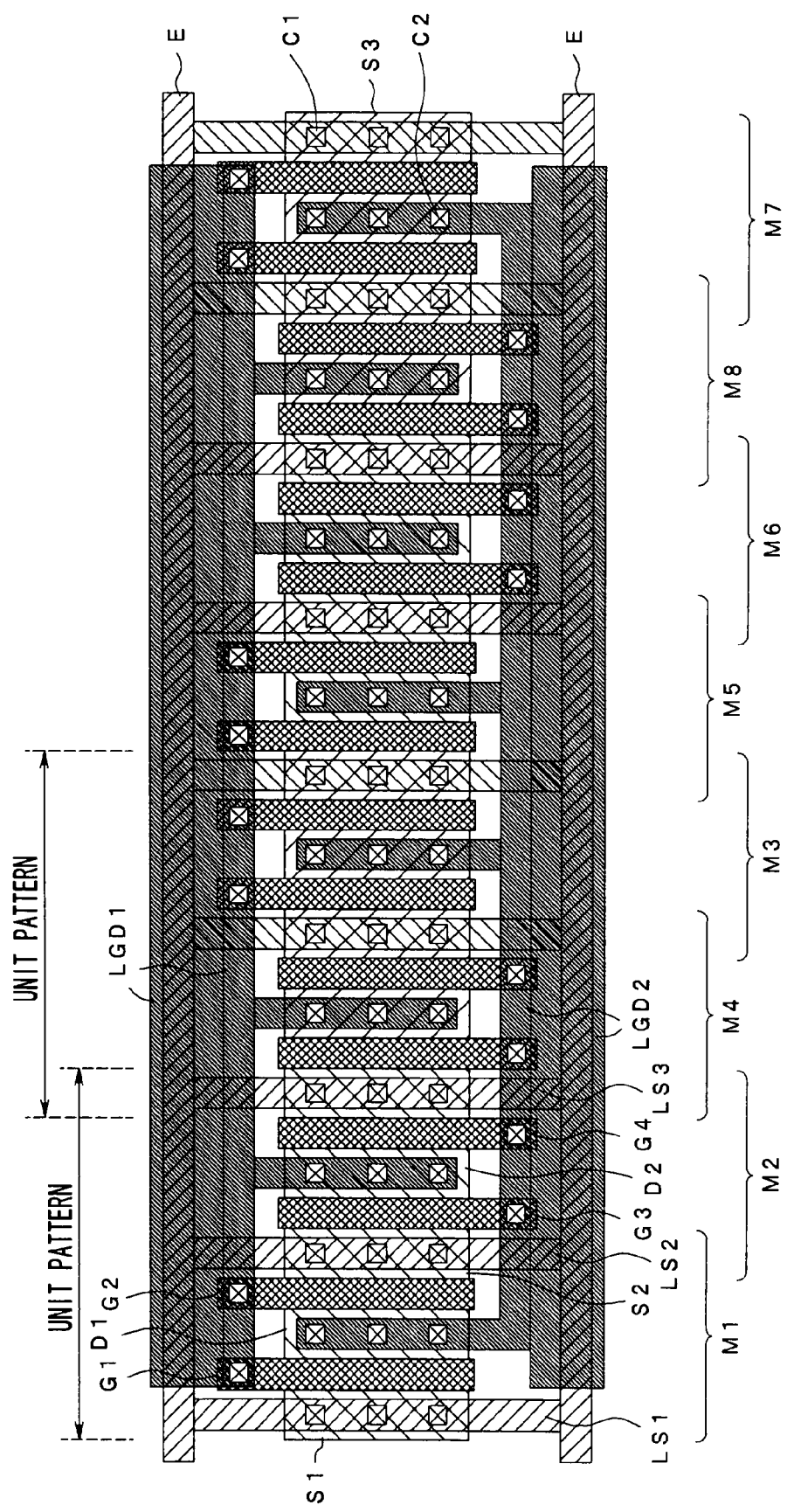
FIG. 5 is an explanatory diagram showing a second embodiment of the present invention.

FIG. 5 is an explanatory diagram showing the second embodiment of the present invention. FIG. 6 is a circuit diagram showing a circuit configuration corresponding to FIG. 5.

The above-described first embodiment is an example in which the number of fingers in the multi-finger configuration is two. By setting a larger number of fingers, it is possible to increase the gate width of transistors. Also in this case, an increase in parasitic resistance can be suppressed by increasing the number of fingers, the layout pattern of FIG. 1 being regarded as the unit.

FIG. 5 shows an example in which the layout pattern of FIG. 1 (hereinafter referred to as the unit pattern) is arranged in quantities of four. When the layout pattern of FIG. 5 is indicated by a circuit diagram, the layout pattern shown in FIG. 6 is obtained. In FIG. 6, four sets of transistor pairs similar to the transistors M1, M2 of FIG. 3 are connected in parallel. If the gate width of each transistor is the same, the gate width of the circuit of FIG. 6 becomes four times the gate width of the transistors M1, M2. If the number of fingers of the multi-finger design is denoted by M and the gate width per finger is denoted by W, then an equivalent gate width becomes a value expressed by M·W.

FIG. 5 shows an example in which the number of fingers of the multi-finger design is eight. In this case, it is necessary only that four unit patters be formed. As shown in FIG. 5, transistors M1 to M8 are formed by four unit patterns. Sources of all of the transistors M1 to M8 are connected to source interconnects LS1 to LS3 via a contacts C 1, and source interconnects LS1 to LS3 of all of the unit patters are connected to a common interconnect E in common.

Drains of the transistors M1, M3, M5, M7 are connected to a common interconnect LGD2 in common, and drains of the transistors M2, M4, M6, M8 are connected to a common interconnect LGD1 in common. And the common interconnect LGD2 is connected to gates G3, G4 of the transistors M2, M4, M6, M8 in common. Also, the common interconnect LGD1 is connected to gates G1, G2 of the transistors M1, M3, M5, M7 in common.

Unit patterns which are adjacent to each other are arranged symmetrically in the vertical direction so that the gates of the transistors M1, M3, M5, M7 can be directly connected together and the gates of the transistors M2, M4, M6, M8 can be directly connected together.

Also in the present embodiment thus configured, the length of an interconnect portion necessary for the cross coupling of a gate and a drain in each unit pattern is sufficiently short. As a result of this, it is possible to sufficiently reduce parasitic resistance. Therefore, it is possible to sufficiently increase the gain of an oscillation transistor constituting a VCO and it is possible to improve the characteristics of the VCO.

As is apparent from a comparison between FIG. 4 and FIG. 5, even when the width of the sources, drains and gates are the same, by adopting the unit pattern of the present embodiment, it is possible to sufficiently reduce the transistor size and hence it is possible to reduce the parasitic capacitance.

Incidentally, in the present embodiment, it becomes necessary to provide interconnects which connect together the transistors mutually connected between unit patterns, but the interconnects can reduce parasitic resistance when the interconnect width is increased to some extent. Because the gate and the drain are connected by use of a common interconnect, the parasitic capacitance is relatively small even when the width of the common interconnect is increased compared to a case where the gate interconnect and the drain interconnect are wired by use of separate interconnects.

Although in the present embodiment the example in which four unit patterns are used is shown, it is apparent that the number of unit patterns is not limited.

Figure 8A:
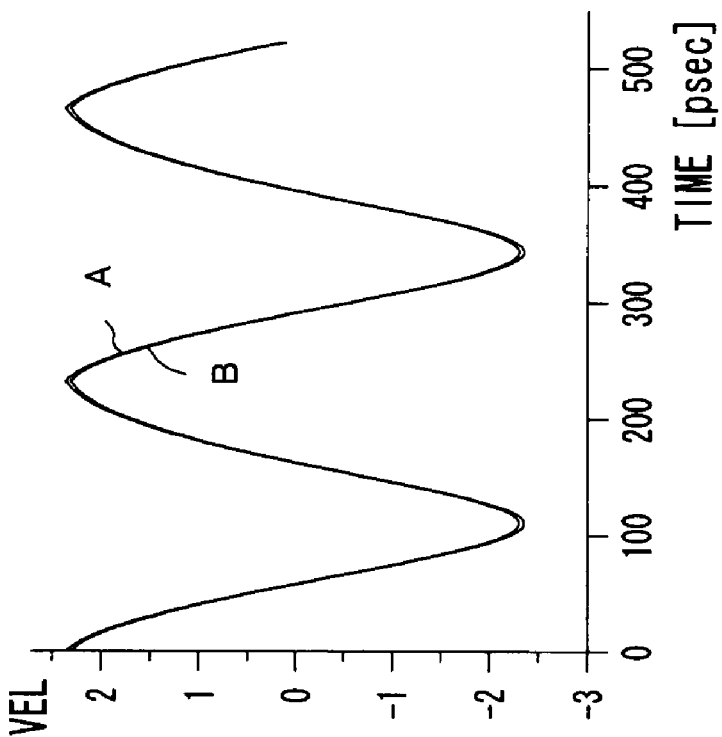
FIGS. 8A and 8B are graphs showing changes in characteristics of a VCO configured by adopting the second embodiment.
Figure 8B:
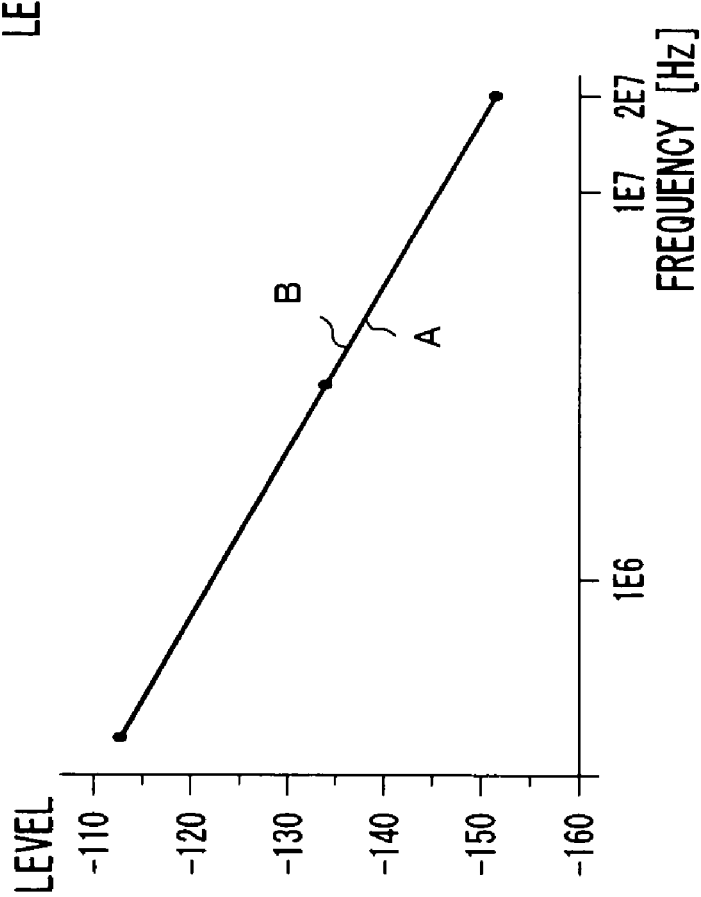

FIGS. 7A, 7B, 8A and 8B are graphs to explain the effect of the present embodiment. FIGS. 7A and 7B show changes in characteristics of a VCO configured without the adoption of the second embodiment, and FIGS. 8A and 8B show changes in characteristics of a VCO configured by adopting the second embodiment. FIGS. 7A and 8A show phase noise characteristics, with frequency plotted as abscissa and the level of phase noise plotted as ordinate. Also, FIGS. 7B and 8B show output waveform, with time plotted as abscissa and output level plotted as ordinate.

In FIGS. 7A, 7B, 8A and 8B, the characteristic A indicates values obtained by a simulation of the circuit diagram of FIG. 6 in disregard of parasitic resistance, and the characteristic B indicates values obtained by finding parasitic resistance in an actual interconnect pattern and taking the found parasitic resistance into consideration.

As shown in FIG. 7A, compared to the characteristic A in which parasitic resistance is not taken into consideration, the characteristic B in which parasitic resistance is taken into consideration is such that the phase noise is large at any frequency. It seems that this is because as shown in FIG. 7B, compared to the characteristic A in which parasitic resistance is not taken into consideration, the characteristic B in which parasitic resistance is taken into consideration is such that the amplitude level of output waveform is smaller.

In contrast to this, in the present embodiment, as shown in FIG. 8B, there is scarcely any difference in the amplitude level of output waveform between the characteristic A in which parasitic resistance is not taken into consideration and the characteristic B in which parasitic resistance is taken into consideration. Therefore, as shown in FIG. 8A, the phase noise is almost the same at any frequency in the characteristic A in which parasitic resistance is not taken into consideration and the characteristic B in which parasitic resistance is taken into consideration.

It will be understood that in the present embodiment it is possible to sufficiently suppress the effect of parasitic resistance on phase noise as described above.

Third Embodiment

Figure 9:
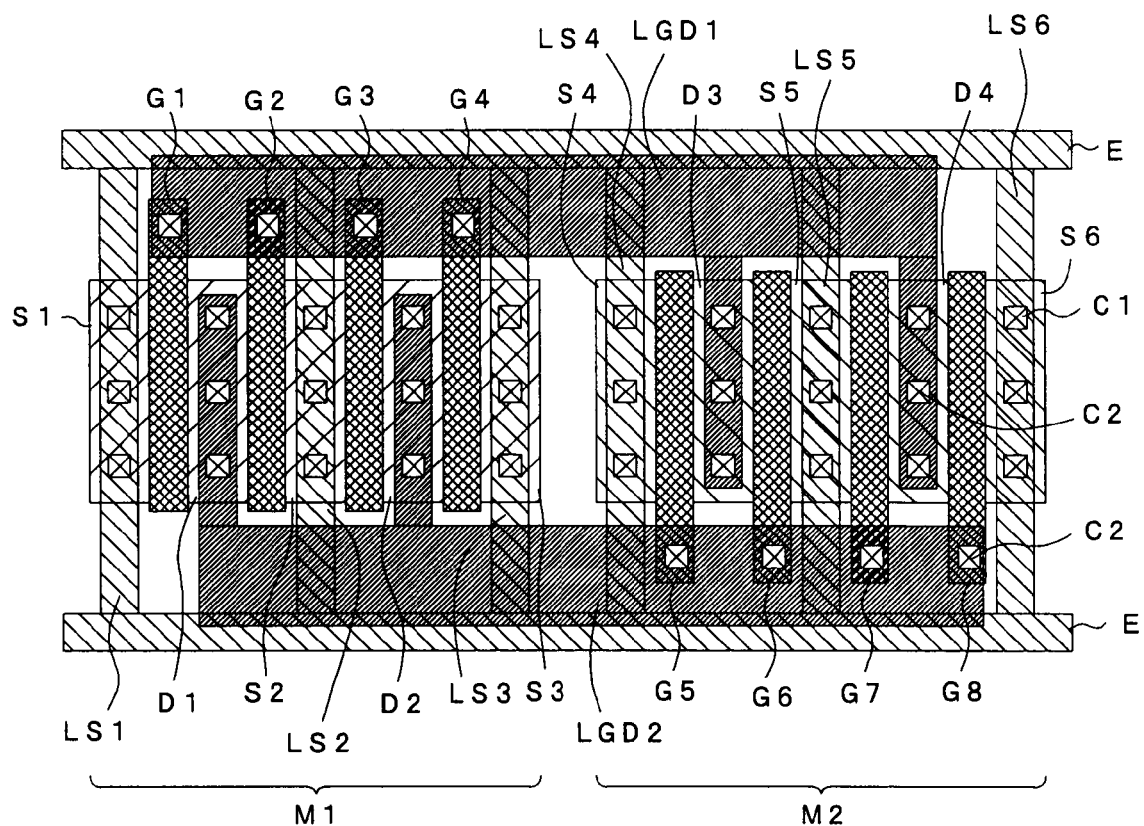
FIG. 9 is an explanatory diagram showing the third embodiment of the present invention.

FIG. 9 is an explanatory diagram showing the third embodiment of the present invention.

Although in the above-described first and second embodiments, a unit pattern in which the number of fingers in a multi-finger configuration is two is adopted, the number of fingers of the unit pattern is not limited to two. For example, FIG. 9 shows an example of a unit pattern in which the number of fingers in a multi-finger configuration is four.

In FIG. 9, a transistor M1 is composed of sources S1 to S3, drains D1, D2, gates G1 to G4 and the like, and a transistor M2 is composed of sources S4 to S6, drains D3, D4, gates G5 to G8 and the like.

The sources S1 to S6 and the drains D1 to D4 are each formed in the shape of a long rectangle two-dimensionally, and the source S1, the drain D1, the source S2, the drain D2, the source S3, the source S4, the drain D3, the source S5, the drain D4, and the source S6 are arranged in this order by being spaced from each other at a distance corresponding to the channel length in the transverse direction of the rectangle. Incidentally, the longitudinal dimensions of the sources S1 to S6 and the drains D1 to D4 are equal to each other.

The gates G1 to G4 are formed between the source S1 and the drain D1, between the drain D1 and the source S2, between the source S2 and the drain D2, and between the drain D2 and the source S3, respectively, and the gates G5 to G8 are formed between the source S4 and the drain D3, between the drain D3 and the source S5, and between the source S5 and the drain D4, between the drain D4 and the source S6, respectively. The sources S1 to S6 are connected to source interconnects LS1 to LS6, respectively, each via a contact C1. The source interconnects LS1 to LS6 are connected in common to a common interconnect E. The source interconnects LS1 to LS6 and the common interconnect E are formed, for example, as a lower-layer interconnect in the first interconnect layer on a substrate.

In the present embodiment, common interconnects are used for the drain interconnects and the gate interconnects. That is, the drains D1, D2 are connected to a common interconnect LGD2 via a contact C2, and the drains D3, D4 are connected to a common interconnect LGD1 via the contact C2. Incidentally, the drain interconnects and the gate interconnects are formed, for example, as an upper-layer interconnect in the second interconnect layer on a substrate.

The common interconnect LGD2 extends on the drains D1, D2 constituting the transistor M1 in the longitudinal direction of the drains D1, D2. The common interconnect LGD2 is such that one end thereof leaves in an extended condition the region where the drains D1, D2 are formed, and extends while bending in the transverse direction of the drains D1, D2 to the side of the region where the transistor M2 is formed. On the other hand, one end of each of the gates G5 to G8 constituting the transistor M2 has a protrusion section which leaves in an extended condition the region where the sources S4 to S6 and the drains D3, D4 are formed, and intersects the common interconnect LGD2 three-dimensionally. In this intersection, the gates G5 to G8 are connected to the common interconnect LGD2 by the contact C2.

On the other hand, the common interconnect LGD1 extends on the drains D3, D4 constituting the transistor M2 in the longitudinal direction of the drains D3, D4. The common interconnect LGD1 is such that one end thereof leaves in an extended condition the region where the drains D3, D4 are formed in a direction in which the common interconnect LGD1 does not overlap the common interconnect LGD2, and extends while bending in the transverse direction of the drains D3, D4 to the side of the region where the transistor M1 is formed. On the other hand, one end of each of the gates G1 to G4 constituting the transistor M1 has a protrusion section which leaves in an extended condition the region where the sources S1 to S3 and the drains D1, D2 are formed, and intersects the common interconnect LGD1 three-dimensionally. In this intersection, the gates G1 to G4 are connected to the common interconnect LGD1 by the contact C2.

Also in the present embodiment, the direction (the upward direction on the paper surface of FIG. 9) in which the gates G1 to G4 leave in an extended condition the region where the sources S1 to S3 and the drains D1, D2 are formed and the direction (the downward direction on the paper surface of FIG. 9) in which the gates G5 to G8 leave in an extended condition the region where the sources S4 to S6 and the drains D3, D4 are formed, are reverse to each other. Therefore, it is possible to arrange the contact between the gates G1 to G4 of the transistor M1 and the common interconnect LGD1 and the contact between the gates G5 to G8 of the transistor M2 and the common interconnect LGD2 in positions reverse to each other in the longitudinal direction of the sources and the drains. That is, it is possible to ensure the arrangement so that the bent common interconnects LGD1, LGD2 do not overlap each other.

Therefore, also in the present embodiment, it is possible to connect the gates of the transistor M1 and the drains of the transistor M2 and to connect the gates of the transistor M2 and the drains of the transistor M1 in a relatively short distance by using only two interconnect layers, which are the lower layer and the upper layer.

As described above, also in the present embodiment, it is possible to obtain an effect similar to that of the first embodiment.

Incidentally, in the above-described embodiments, the descriptions were given of examples in which the present invention is applied to an oscillation transistor of a VCO, it is apparent that the present invention is applicable to various kinds of circuits so long as the circuits have transistors of a differential configuration.

Having described the preferred embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A semiconductor integrated circuit device, comprising:
a first active region in which a source and a drain constituting one of transistors of a differential configuration are alternately arranged;
a plurality of first gates each of which is formed between the source and drain of the first active region and each of which has a first protrusion section protruding from the first active region;
a second active region in which a source and a drain constituting the other transistor of the transistors of a differential configuration are alternately arranged adjacent to the first active region;
a plurality of second gates each of which is formed between the source and drain of the second active region and each of which has a second protrusion section protruding from the second active region in a direction opposite to a protruding direction of the first gate;
a first common interconnect which connects all sources of the first and second active regions in common;
a second common interconnect which is formed on the first protrusion section of the plurality of first gates and on all drains of the second active region and connects the plurality of first gates and all drains of the second active region; and
a third common interconnect which is formed on the second protrusion section of the plurality of second gates and on all drains of the first active region and connects the plurality of second gates and all drains of the first active region.

2. The semiconductor integrated circuit device according to claim 1, wherein the first and second active regions are such that all sources and drains constituting one and the other of the transistors of a differential configuration are alternately arranged in a row.

3. The semiconductor integrated circuit device according to claim 1, wherein at least either of the source and the drain is shared in the one and the other of the transistors of a differential configuration.

4. The semiconductor integrated circuit device according to claim 2, wherein at least either of the source and the drain is shared in the one and the other of the transistors of a differential configuration.

5. The semiconductor integrated circuit device according to claim 2, wherein the first and second active regions are composed of three sources and two drains arranged between each of the sources.

6. The semiconductor integrated circuit device according to claim 1, wherein the first and second protrusion sections are extended in a direction orthogonal to a direction in which the source and the drain are alternately arranged.

7. The semiconductor integrated circuit device according to claim 2, wherein the first and second protrusion sections are extended in a direction orthogonal to a direction in which the source and the drain are alternately arranged.

8. The semiconductor integrated circuit device according to claim 1, wherein the second common interconnect and the third common interconnect are arranged in positions on sides opposite to each other, with the first and second active regions arranged therebetween.

9. The semiconductor integrated circuit device according to claim 2, wherein the second common interconnect and the third common interconnect are arranged in positions on sides opposite to each other, with the first and second active regions arranged therebetween.

10. The semiconductor integrated circuit device according to claim 1, wherein the second common interconnect and the third common interconnect are formed in the shape of a letter L.

11. The semiconductor integrated circuit device according to claim 2, wherein the second common interconnect and the third common interconnect are formed in the shape of a letter L.

12. The semiconductor integrated circuit device according to claim 1, wherein the first common interconnect is formed so as to surround the first and second active regions.

13. The semiconductor integrated circuit device according to claim 2, wherein the first common interconnect is formed so as to surround the first and second active regions.

14. The semiconductor integrated circuit device according to claim 1, wherein the first common interconnect is formed in a first interconnect layer on a substrate and the second and third common interconnects are formed in a second interconnect layer on the substrate.

15. The semiconductor integrated circuit device according to claim 2, wherein the first common interconnect is formed in a first interconnect layer on a substrate and the second and third common interconnects are formed in a second interconnect layer on the substrate.

16. The semiconductor integrated circuit device according to claim 1, wherein one source of the first active region and one source of the second active region are shared.

17. The semiconductor integrated circuit device according to claim 2, wherein one source of the first active region and one source of the second active region are shared.

18. A semiconductor integrated circuit device formed by arranging a plurality of unit patterns, the unit pattern being a pattern consisting of a first active region in which a source and a drain constituting one of transistors of a differential configuration are alternately arranged; a plurality of first gates each of which is formed between the source and drain of the first active region and each of which has a first protrusion section protruding from the first active region; a second active region in which a source and a drain constituting the other transistor of the transistors of a differential configuration are alternately arranged adjacent to the first active region; a plurality of second gates each of which is formed between the source and drain of the second active region and each of which has a second protrusion section protruding from the second active region in a direction opposite to a protruding direction of the first gate; a first common interconnect which connects all sources of the first and second active regions in common; a second common interconnect which is formed on the first protrusion section of the plurality of first gates and on all drains of the second active region and connects the plurality of first gates and all drains of the second active region; and a third common interconnect which is formed on the second protrusion section of the plurality of second gates and on all drains of the first active region and connects the plurality of second gates and all drains of the first active region.

19. A semiconductor integrated circuit device, comprising:
a first active region in which a source and a drain constituting one of transistors of a differential configuration are alternately arranged;
a plurality of first gates each of which is formed between the source and drain of the first active region and each of which has a first protrusion section protruding from the first active region;
a second active region in which a source and a drain constituting the other transistor of the transistors of a differential configuration are alternately arranged adjacent to the first active region;
a plurality of second gates each of which is formed between the source and drain of the second active region and each of which has a second protrusion section protruding from the second active region in a direction opposite to a protruding direction of the first gate;
a first common interconnect which connects all sources of the first and second active regions in common;
a second common interconnect which is formed on the first protrusion section of the plurality of first gates and on all drains of the second active region and connects the plurality of first gates and all drains of the second active region;
a third common interconnect which is formed on the second protrusion section of the plurality of second gates and on all drains of the first active region and connects the plurality of second gates and all drains of the first active region; and
an LC resonance circuit which is connected between the second common interconnect and the third common interconnect.

20. A semiconductor integrated circuit device, comprising:
a first transistor and a second transistor which constitute a circuit of a differential configuration;
the first transistor having a source and a drain,
the source and the drain being arranged alternately,
the second transistor having a source and a drain, and
the source and the drain being arranged alternately,
a first common interconnect which connects all sources of the first and second transistors in common;
a plurality of first gates formed between a source and a drain of the first transistor;
one end of each of the plurality of first gates being connected to a first common interconnect, and
the first common interconnect being connected to a drain of the second transistor,
a plurality of second gates formed between a source and a drain of the second transistor;
one end of each of the plurality of second gates being connected to a second common interconnect,
the second common interconnect being connected to a drain of the first transistor, and
the first common interconnect and the second interconnect being arranged so as to be opposite to each other, and
an LC resonance circuit which is connected between the second common interconnect and the third common interconnect.

* * * * *